US007521996B2

(12) United States Patent
Kluge

(10) Patent No.: US 7,521,996 B2
(45) Date of Patent: Apr. 21, 2009

(54) DIFFERENTIAL AMPLIFIER AND RADIO SYSTEM WITH A DIFFERENTIAL AMPLIFIER

(75) Inventor: Wolfram Kluge, Dresden (DE)

(73) Assignee: Atmel Germany GmbH, Heilbronn (DE)

( * ) Notice: Subject to any disclaimer, the term of this patent is extended or adjusted under 35 U.S.C. 154(b) by 12 days.

(21) Appl. No.: 11/700,791

(22) Filed: Feb. 1, 2007

(65) Prior Publication Data

US 2007/0176679 A1    Aug. 2, 2007

(30) Foreign Application Priority Data

Feb. 1, 2006    (DE) ................ 10 2006 004 952

(51) Int. Cl.
*H03F 3/45* (2006.01)
(52) U.S. Cl. ..................... 330/252; 330/253
(58) Field of Classification Search .......... 330/252, 330/253
See application file for complete search history.

(56) References Cited

U.S. PATENT DOCUMENTS

| 5,343,162 | A | * | 8/1994 | Davis .................. 330/252 |
| 6,023,192 | A | | 2/2000 | Didier |
| 6,373,337 | B1 | | 4/2002 | Ganser |
| 6,392,486 | B1 | | 5/2002 | Lemay, Jr. |
| 6,774,721 | B1 | * | 8/2004 | Popescu et al. .......... 330/253 |

FOREIGN PATENT DOCUMENTS

EP    1 067 679 A2    1/2001

OTHER PUBLICATIONS

Manfred Seifart, "Analoge Schaltungen," 4th edition, Verlag Technik Berlin, 1994, pp. 107ff.
Alireza Zolfaghari et al., "A Low-Power 2.4-GHz Transmitter/Receiver CMOS IC," IEEE Journal of Solid-State Circuits, vol. 38, No. 2, Feb. 2003, pp. 176-183.
Knut Kieschnick et al., "High-Sensitivity BiCMOS OEIC for Optical Storage Systems," IEEE Journal of Solid-State Circuits, vol. 38, No. 4, Apr. 2003, pp. 579-584.
Praveen Kallam et al., "An Enhanced Adaptive Q-Tuning Scheme for a 100-MHz Fully Symmetric OTA-Based Bandpass Filter," IEEE Journal of Solid-State Circuits, vol. 38, No. 4, Apr. 2003, pp. 585-593.
Jussi Ryynänen et al., "A Single-Chip Multimode Receiver for GSM 900, DCS 1800, PCS 1900, and WCDMA," IEEE Journal of Solid-State Circuits, vol. 38, No. 4, Apr. 2003, pp. 594-602.
June-Ming Hsu, "A 0.18-μm CMOS Offset-PLL Upconversion Modulation Loop IC for DCS 1800 Transmitter," IEEE Journal of Solid-State Circuits, vol. 38, No. 4, Apr. 2003, pp. 603-613.

(Continued)

*Primary Examiner*—Steven J Mottola
(74) *Attorney, Agent, or Firm*—Muncy, Geissler, Olds & Lowe, PLLC

(57) ABSTRACT

A radio system for communication is provided that has a differential amplifier for amplifying a transmission frequency, particularly 2.4 GHz, wherein the differential amplifier has a first inductor, which is magnetically coupled to a second inductor, and a capacitor. The capacitor, the first inductor, and the second inductor are wired into a resonant circuit in such a way that the resonant circuit has a common-mode impedance for a common-mode signal and a push-pull impedance, different from the common-mode impedance, for the push-pull signal.

21 Claims, 4 Drawing Sheets

OTHER PUBLICATIONS

M.-J. Edward Lee et al., "Jitter Transfer Characteristics of Delay-Locked Loops—Theories and Design Techniques," IEEE Journal of Solid-State Circuits, vol. 38, No. 4, Apr. 2003, pp. 614-621.

Stanley E. Schuster et al., "Low-Power Synchronous-to-Asynchronous-to-Synchronous Interlocked Pipelined CMOS Circuits Operating at 3.3-4.5 GHz," IEEE Journal of Solid-State Circuits, vol. 38, No. 4, Apr. 2003, pp. 622-630.

Jae-Yoon Sim et al., "A 1.8-V 128-Mb Mobile DRAM With Double Boosting Pump, Hybrid Current Sense Amplifier, and Dual-Referenced Adjustment Scheme for Temperature Sensor," IEEE Journal of Solid-State Circuits, vol. 38, No. 4, Apr. 2003, pp. 631-640.

Byung-Do Yang et al., "A Low-Power ROM Using Charge Recycling and Charge Sharing Techniques," IEEE Journal of Solid-State Circuits, vol. 38, No. 4, Apr. 2003, pp. 641-653.

Chi-Sheng Lin et al., "A Low-Power Precomputation-Based Fully Parallel Content-Adressable Memory," IEEE Journal of Solid-State Circuits, vol. 38, No. 4, Apr. 2003, pp. 654-662.

Ahmed Nader Mohieldin et al., "A Fully Balanced Pseudo-Differential OTA With Common-Mode Feedforward and Inherent Common-Mode Feedback Detector," IEEE Journal of Solid-State Circuits, vol. 38, No. 4, Apr. 2003, pp. 663-668.

Choong-Yul Cha et al., "A 5.2-GHz LNA in 0.35-μm CMOS Utilizing Inter-Stage Series Resonance and Optimizing the Substrate Resistance," IEEE Journal of Solid-State Circuits, vol. 38, No. 4, Apr. 2003, pp. 669-672; and.

Hsiang-Hui Chang et al., "A Spread-Spectrum Clock Generator With Triangular Modulation," IEEE Journal of Solid-State Circuits, vol. 38, No. 4, Apr. 2003, pp. 673-676.

Gramegna G et al., "An 8.2-GHz, 14.4 mW, 16dB NF SiGe Bipolar LNA with DC current reuse", Proceedings of the 2003 Bipolar/Bicmos Circuits and Technology Meeting, Toulouse, France, Sep. 28-30, 2003, pp. 49-51.

Che-Hong Liao et al: "A 5.7-GHz 0.18-/spl mu/m CMOS gain-controlled differential LNA with current reuse for WLAN receiver", IEEE Microwave and Wireless Components Letters, IEEE Service Center, New York, NY, US, vol. 13, No. 12, Dec. 2003, pp. 526-527.

\* cited by examiner ptext
DIFFERENTIAL AMPLIFIER AND RADIO SYSTEM WITH A DIFFERENTIAL AMPLIFIER This nonprovisional application claims priority under 35 U.S.C. § 119(a) on German Patent Application No. DE 102006004952, which was filed in Germany on Feb. 1, 2006, and which is herein incorporated by reference.

BACKGROUND OF THE INVENTION

1. Field of the Invention

The present invention relates to a differential amplifier and a radio system with a differential amplifier.

2. Description of the Background Art

High-frequency amplifiers are required for a multitude of applications. Thus, high-frequency amplifiers are used to amplify radio signals that are received or to be transmitted. Furthermore, high-frequency amplifiers are used in sensor systems, mobile telephones, or radar installations. It is moreover sufficient for several applications, that the amplifier amplifies only a narrow frequency band within the range of an operating frequency. This type of amplifier can also be called a selective amplifier.

A differential circuit is disclosed, for example, in "Analoge Schaltungen" (Analog Circuits), Seifart, $4^{th}$ edition, Verlag Technik Berlin, 1994, pages 107ff. The output voltage of the differential amplifier is proportional to the differential voltage between two input terminals. Common-mode voltages, which act at both inputs with the same amplitude and phase position, are not amplified by the ideal differential amplifier. The differential amplifier receives advantageous properties from its largely symmetric structure. The emitters of the two input transistors are thereby typically connected to one another and to a constant-current source.

A low-power 2.4-GHz transmitter/receiver—CMOS IC with a differential amplifier is known from IEEE Journal of Solid-State Circuits, Vol. 38, No. 2, February 2003, pages 176ff. A 5.2-GHz low-noise amplifier in 0.35 μm CMOS technology with a differential amplifier is known from IEEE Journal of Solid-State Circuits, Vol. 38, No. 4, April 2003.

SUMMARY OF THE INVENTION

It is an object of the present invention to provide a differential amplifier for a high frequency with electrical properties being improved. A further object is to develop a radio system with a differential amplifier.

A differential amplifier is provided which has a first inductor that is magnetically coupled to a second inductor. Furthermore, the differential amplifier has a capacitor. The capacitor, the first inductor, and the second inductor are wired into a resonance circuit in such a way that the resonant circuit has a common-mode impedance for a common-mode signal and a push-pull impedance, different from the common-mode impedance, for a push-pull signal.

A common-mode signal is taken to mean a signal that is applied at both inputs of the differential amplifier with the same frequency, same phase position, and same amplitude. A push-pull signal is taken to mean a signal, applied at the inputs, with the same frequency, same amplitude, and a phase shifted by 180°. Common-mode signals and push-pull signals can also be superimposed on one another. The push-pull signal is typically the useful signal in this case.

An effective input impedance of a following stage and/or influencing parasitic impedances are preferably taken into account in the layout to form the resonance for the common-mode signal. The differential amplifier can be designed as a selective amplifier for amplifying signals of one or more operating frequencies. In this case, the resonance of the resonant circuit can be matched to at least one operating frequency, for example, 2.4 GHz. The resonant circuit can also be called an oscillating circuit. The first inductor and the second inductor can be designed the same within the scope of manufacturing tolerances.

The differential amplifier can be designed for amplifying high-frequency signals, high frequency being understood to mean, for example, that a range in which the transient behavior of the transistors is substantially influenced by parasitic impedances, particularly by the Miller effect.

The resonant circuit can form, for example, a common-mode input impedance and a push-pull input impedance, in order to dampen the push-pull input signal less extensively than the common-mode input signal. In an embodiment, a first transistor and a second transistor are provided, the resonant circuit being connected to the first transistor and the second transistor in such a way that the resonant circuit forms a particularly symmetric load for the first transistor and for the second transistor. The first transistor and the second transistor can be made the same within the scope of manufacturing tolerances (matching). The amplification by the first transistor and the second transistor can depend on the extent of the impedance.

Another embodiment of the invention provides that the first transistor and the second transistor can be wired into a gate circuit. If bipolar transistors are used instead of field-effect transistors, these can be wired into the base circuit. In the gate circuit, the gate terminals can be connected to a constant voltage source and thereby short-circuited to ground AC-wise relative to the signal to be amplified. In the base circuit, the bases of the first transistor and the second transistor can be connected to a constant-voltage source and thereby also short-circuited to ground AC-wise. Alternative embodiments have transistors in the source circuit or emitter circuit. The variant with a drain circuit or a collector circuit is also exemplary to achieve a very high input impedance. In each of these embodiments, the resonant circuit can be the load of the differentially wired transistors.

According to an embodiment, a first source terminal or a first emitter terminal of the first transistor can be connected to a first input of the differential amplifier, and a second source terminal or a second emitter terminal of the second transistor to a second input of the differential amplifier. Preferably, no current sources or current drains are connected to these input transistors here.

To configure this embodiment further, a transconductance of the first transistor and a transconductance of the second transistor are designed to form an input impedance of the differential amplifier of 50 ohm. The geometries (channel width/channel length) and/or the doping profile can be matched to the requirements for the input impedance. The first source terminal or the first emitter terminal of the first transistor and the second source terminal or the second emitter terminal of the second transistor are connected to another resonant circuit of the differential amplifier.

In an embodiment, for a push-pull signal, the resonance frequency of both resonant circuits is the same within the scope of manufacturing tolerances (matching).

The first inductor and the second inductor can be formed by symmetric coil windings. The winding direction here determines the sign of the magnetic coupling. The magnetic coupling can be positive in a symmetric coil winding.

According to another embodiment, the first inductor and the second inductor can be formed by an integrated coil with a center tap.

The first inductor and the second inductor can be magnetically coupled in such a way that for common-mode signals the voltage signal, dropping across the first inductor due to a load current, and the induced voltage signal are superimposed destructively. However, the voltage signal, dropping across the first inductor due to a load current, and the induced voltage signal for push-pull signals are superimposed constructively. The induced voltage signal is induced in this case by a magnetic field, generated by the second inductor. This can also apply to the converse case in which a voltage signal is induced in the second inductor.

Another embodiment of the invention has two cascaded amplifier stages. In this regard, a first amplifier stage has the first transistor and the second transistor. A second amplifier stage has a third transistor and a fourth transistor. The first amplifier stage and the second amplifier stage can be operated by an identical operating current, which flows both through the first amplifier stage and through the second amplifier stage. The third transistor and the fourth transistor can be made the same within the scope of manufacturing tolerances (matching).

Another embodiment provides that the third transistor and the fourth transistor can each be wired into a source circuit or an emitter circuit. A third gate terminal or a third base terminal of the third transistor is preferably connected via a first coupling capacitor to the first drain terminal or to the first collector terminal of the first transistor. Likewise, a fourth gate terminal or a fourth base terminal of the fourth transistor can be connected via a second coupling capacitor to the second drain terminal or to the second collector terminal of the second transistor.

In a further embodiment, a fifth transistor and a sixth transistor are provided. The fifth transistor can be connected with the third transistor to a first cascode stage. The sixth transistor can be connected with the fourth transistor to a second cascode stage.

In another embodiment, capacitors are provided for neutralizing the Miller capacitances of the third transistor and the fourth transistor. A fifth transistor and a sixth transistor can be provided as capacitors for neutralization. The fifth transistor can be connected to the third transistor and the fourth transistor for neutralizing the Miller capacitance of the third transistor. The sixth transistor can be connected to the fourth transistor and the third transistor for neutralizing the Miller capacitance of the fourth transistor.

According to another embodiment, a further resonant circuit can be provided as a load of the second amplifier stage. The resonant circuit can be connected to the third transistor and the fourth transistor, provided no cascode stage is used. Otherwise, the additional resonant circuit can be connected to the fifth transistor and the sixth transistor to form the second amplifier stage.

In a further embodiment, the radio system can have transmitting and receiving units for communication. The radio system can have a differential amplifier for amplifying a transmission frequency. The transmission frequency is, for example, 2.4 GHz. The differential amplifier can have a first inductor, which is magnetically coupled to a second inductor, and a capacitor.

The capacitor, the first inductor, and the second inductor can be wired into a resonant circuit in such a way that the resonant circuit has a common-mode impedance for a common-mode signal of the transmission frequency. Furthermore, the resonant circuit for a push-pull signal has a push-pull impedance different from the common-mode impedance.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
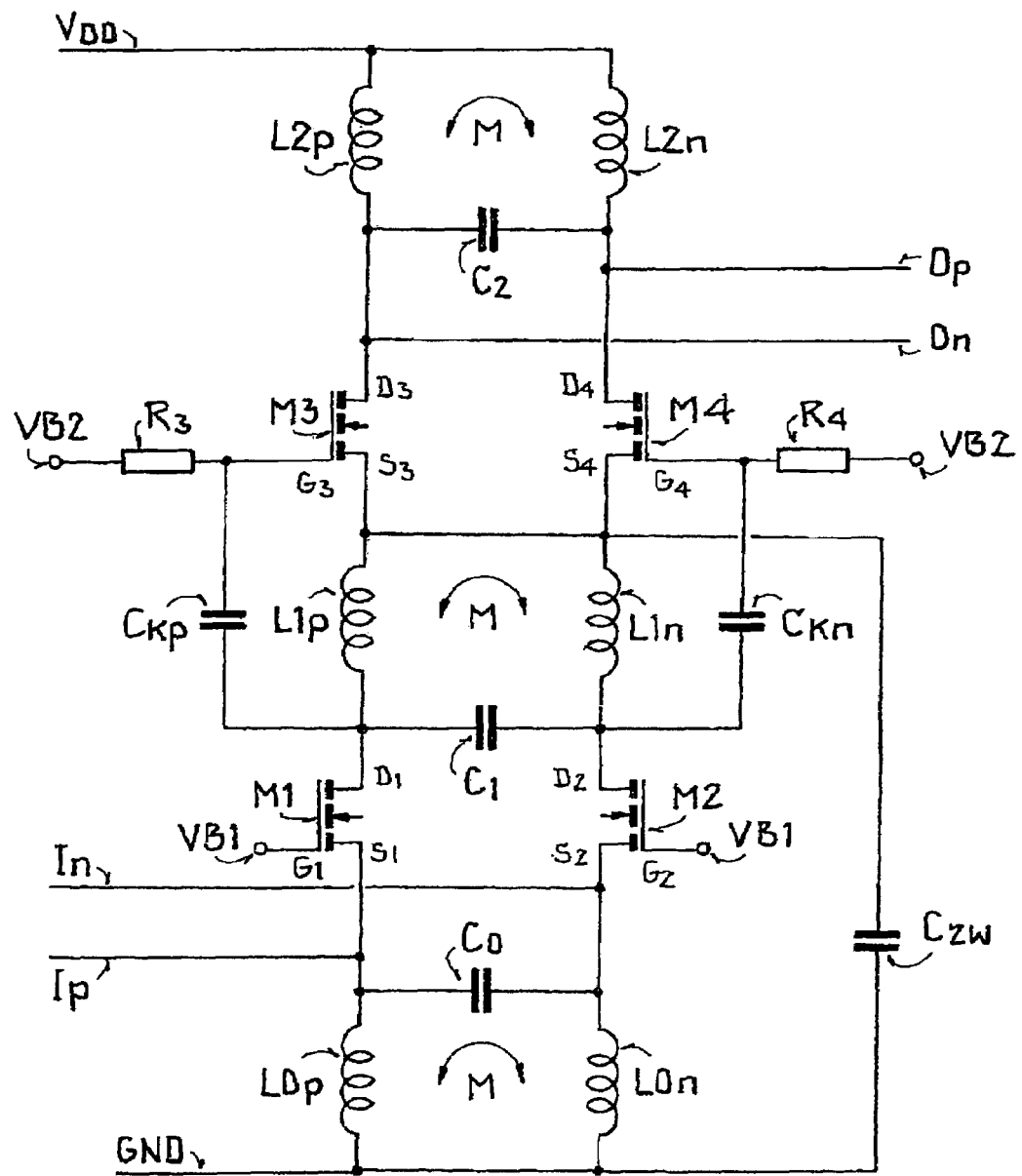
FIG. 1 shows a first circuit of a differential amplifier.

FIG. 1 shows a first exemplary embodiment of a differential amplifier. The differential amplifier of FIG. 1 is laid out for an operating frequency of, for example, 2.4 GHz. It is therefore sufficient that the differential amplifier is designed as a selective amplifier and amplifies a frequency range at the operating frequency. The differential amplifier of FIG. 1 has a first positive input $I_p$ and a second negative input $I_n$ for amplifying a differential signal.

The differential amplifier of FIG. 1 is designed in this case in such a way that a push-pull signal at the inputs $I_n$ and $I_p$ is amplified significantly more greatly than a common-mode signal applied at the inputs $I_n$ and $I_p$. The ratio of the amplification of the push-pull signal to the amplification of the common-mode signal is also called common-mode rejection. This common-mode rejection is required for the differential input $I_n$, $I_p$, to achieve a suppression of interferences, which may arise as switching noise in the digital portion of an integrated circuit.

The differential amplifier of FIG. 1 has a first amplifier stage and a second amplifier stage, which are cascaded. The first amplifier stage has a first N-channel field-effect transistor M1, which is connected to the positive input $I_p$, and a second N-channel field-effect transistor M2, which is connected to the negative input $I_n$. The first transistor M1 and the second transistor M2 are wired into a gate circuit, whereby the first gate G1 of the first transistor M1 and the second gate G2 of the second transistor M2 are at a substantially constant voltage potential $V_{B1}$.

The gate circuit of FIG. 1 has the advantage that an input capacitance is significantly reduced compared to a source circuit, because at a given transistor width the source capacitance is smaller than the gate capacitance. Furthermore, the source terminal S1, S2 is much more robust to an electrostatic discharge than the gate terminal G1, G2 of the same transistor M1, M2. Another advantage of the circuit of FIG. 1 is that the desired input resistance of, for example, 50 ohm can be set in a simple way. The input resistance in this case is inversely proportional to the transconductance of the transistor M1, M2. Through the use of the dopant profile and the geometry (length, width) of the transistor M1, M2, its transconductance can be set application-specific.

A first drain terminal D1 of the first transistor M1 is connected to a resonant circuit. A second drain terminal D2 of the second transistor M2 is also connected to the resonant circuit. The resonant circuit in this case is wired as the load for the first transistor M1 and the second transistor M2. The resonant circuit has a first inductor $L_{1p}$ and a second inductor $L_{1n}$, which are functionally connected to one another via a magnetic coupling M.

The first inductor $L_{1p}$ is connected to the first drain terminal D1 of the first transistor M1. The second inductor $L_{1n}$ is connected to the second drain terminal D2 of the second transistor M2. Furthermore, the first inductor $L_{1p}$ and the second inductor $L_{1n}$ are connected to a capacitor $C_{ZW}$, which short-circuits the electrical connection of the two inductors $L_{1p}$, $L_{1n}$ to ground GND relative to the operating frequency. Furthermore, the resonant circuit has a capacitor $C_1$, which is connected, on the one hand, to the first drain terminal D1 of the first transistor M1 and the first inductor $L_{1p}$ and, on the other, to the second drain terminal D2 of the second transistor M2 and the second inductor $L_{1n}$. The magnetically coupled inductors $L_{1p}$, $L_{1n}$ are designed, for example, as integrated coils with a center tap. To integrate these coils, wiring levels of a chip can be used, whereby an insulator ($SiO_2$ or the like) with a relative permeability of 1 is used within the coil windings. The capacitor $C_1$ is designed, for example, as an integrated plate capacitor.

The resonance of the resonant circuit $L_{1p}$, $L_{1n}$, $C_1$ with consideration of further connected impedances, such as, for example, the capacitors $C_{Kp}$ and $C_{Kn}$, is matched to a push-pull input signal, applied at the inputs $I_n$ and $I_p$ and having the operating frequency, in such a way that the resonant circuit $L_{1p}$, $L_{1n}$, $C_1$ has an impedance maximum for the push-pull-input signal at the operating frequency in or near the resonance. For the impedance maximum, the first amplifier stage with the transistor M1 and M2 in a base circuit achieves an amplification maximum.

However, the resonant circuit $L_{1p}$, $L_{1n}$, $C_1$ is matched for the push-pull signals in such a way that the impedance of the resonant circuit $L_{1p}$, $L_{1n}$, $C_1$ for these signals is significantly lower than the impedance maximum for the push-pull signal of the operating frequency. The different impedances for push-pull and common-mode signals are effected in that the capacitor $C_1$ is inactive for the push-pull signals. Furthermore, the inductive coupling M of the first inductor $L_{1p}$ with the second inductor $L_{1n}$ has the effect that common-mode signals in each inductor $L_{1p}$, $L_{1n}$ are superimposed destructively and thereby the resonance-determining inductors $L_{1p}$, $L_{1n}$ accordingly have a reduced activity. The coupling M is preferably designed in such a way that during push-pull operation the total inductance in the resonant circuit is increased by double the value of the inductive coupling M.

During push-pull operation, the total inductance is $$L=L_{1p}+L_{1n}+2M$$

and during common-mode operation $$L=L_{1p}+L_{1n}-2M.$$

The lower total inductance during common-mode operation results in a higher resonance frequency of the load resonating circuit $L_{1p}$, $L_{1n}$, $C_1$ and thereby in a lower amplification at the operating frequency, to which the resonant circuit $L_{1p}$, $L_{1n}$, $C_1$ is matched during push-pull operation. At lower coil qualities of 5 to 6, which can be achieved for integrated inductors $L_{1p}$ and $L_{1n}$, common-mode rejections of 15 dB to 20 dB per amplifier stage can be achieved by means of the circuit structure of FIG. 1

The circuit of FIG. 1, moreover, has the advantage that a current source at the source terminals S1 and S2 of the first transistor M1 and the second transistor M2 can be eliminated. This type of source current would require an additional voltage drop, which is lost to the amplifier stages and thereby reduces the maximum voltage swing. Instead of the current source, the transistor M1 and M2 are wired into a source circuit.

Parallel to the inputs, another resonant circuit $L_{0p}$, $L_{0n}$, $C_0$ is connected to ground GND. Two magnetically coupled inductors $L_{0p}$ and $L_{0n}$ are again provided, whereby the first inductor $L_{0p}$ is connected to ground GND and to the first source terminal S1 of the first transistor M1. The second inductor $L_{0n}$ is connected to ground GND and to the second source terminal S2 of the second transistor M2. This resonant circuit again forms an impedance maximum for push-pull signals for the operating frequency. By the parallel connection of the input impedance of 50 ohm of the first transistor M1 and the second transistor M2, the total input impedance of the differential amplifier of FIG. 1, however, is limited to this 50 ohm. For common-mode signals of the operating frequency, the total input impedance can be lower according to the above statements on load impedance.

The circuit of FIG. 1 is designed as a cascaded arrangement of two amplifier stages. Both amplifier stages thereby use the same quiescent current for operating point setting. The sum of the direct currents flowing through the first transistor M1 and through the second transistor M2, thereby, corresponds to the sum of the direct currents flowing through the third transistor M3 and the fourth transistor M4. Both stages are decoupled relative to the operating frequency by a capacitor $C_{ZW}$, because this capacitor $C_{ZW}$ represents an alternating voltage short-circuit to ground GND for the operating frequency. For constant operating point currents, a substantially constant intermediate voltage therefore drops across this capacitor $C_{ZW}$.

The differential output of the first amplifier stage is coupled AC-wise to the differential input of the second amplifier stage comprising the transistors M3 and M4 across two integrated coupling capacitors $C_{Kp}$ and $C_{Kn}$. The third transistor M3 and the fourth transistor M4 are wired into a source circuit. The third gate G3 of the third transistor M3 is connected via a high-impedance resistor R3 to a constant voltage source $V_{B2}$ for operating point setting and to capacitor $C_{Kp}$ for coupling in the AC voltage signal. The fourth gate G4 of the fourth transistor M4 is connected via a high-impedance resistor R4 to the same constant voltage source $V_{B2}$ for operating point setting and to capacitor $C_{Kn}$ for coupling in the AC voltage signal.

Another resonant circuit $L_{2p}$, $L_{2n}$, $C_2$ is again connected as load to the third drain terminal D3 of the third transistor M3 and to the fourth drain terminal D4 of the fourth transistor M4. Furthermore, the negative output $O_n$ of the differential amplifier is connected to the third drain terminal D3 of the third transistor M3, and the positive output $O_p$ of the differential amplifier to the fourth drain terminal D4 of the fourth transistor M4.

The additional resonant circuit $L_{2p}$, $L_{2n}$, $C_2$ of the second amplifier stage acts as a load similar to the load resonating circuit $L_{1p}$, $L_{1n}$, $C_1$ of the first amplifier stage. For push-pull signals of the operating frequency, the additional resonant circuit $L_{2p}$, $L_{2n}$, $C_2$ has an impedance maximum in its resonance, so that the amplification of the second amplifier stage is maximized for push-pull signals. On the contrary, for common-mode signals the impedance is significantly smaller and thereby also the amplification of these common-mode signals. A common-mode rejection of 30 dB to 40 dB is therefore achievable by both amplifier stages.

Figure 2:
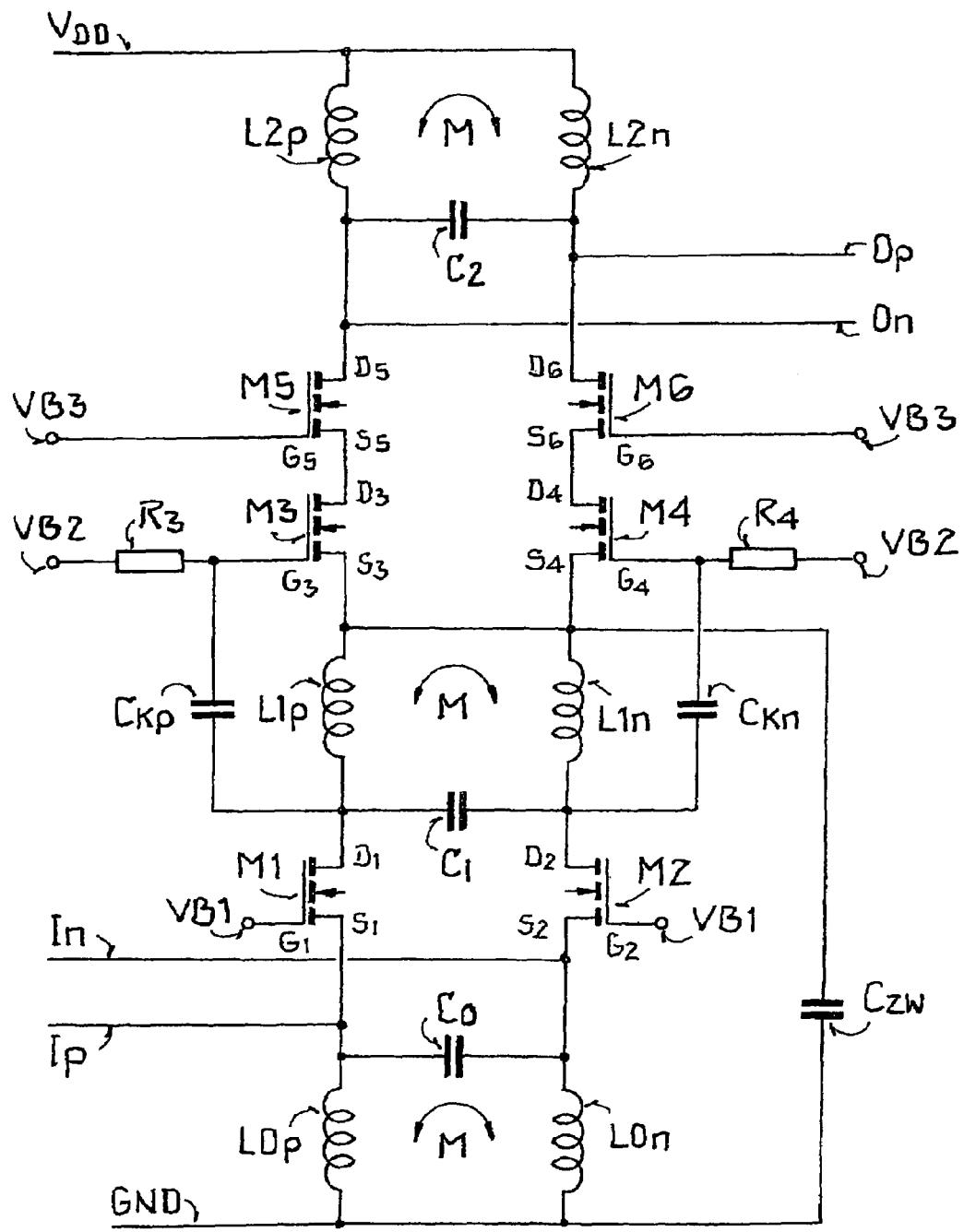
FIG. 2 shows a second circuit of a differential amplifier with two cascode arrangements.
Figure 3:
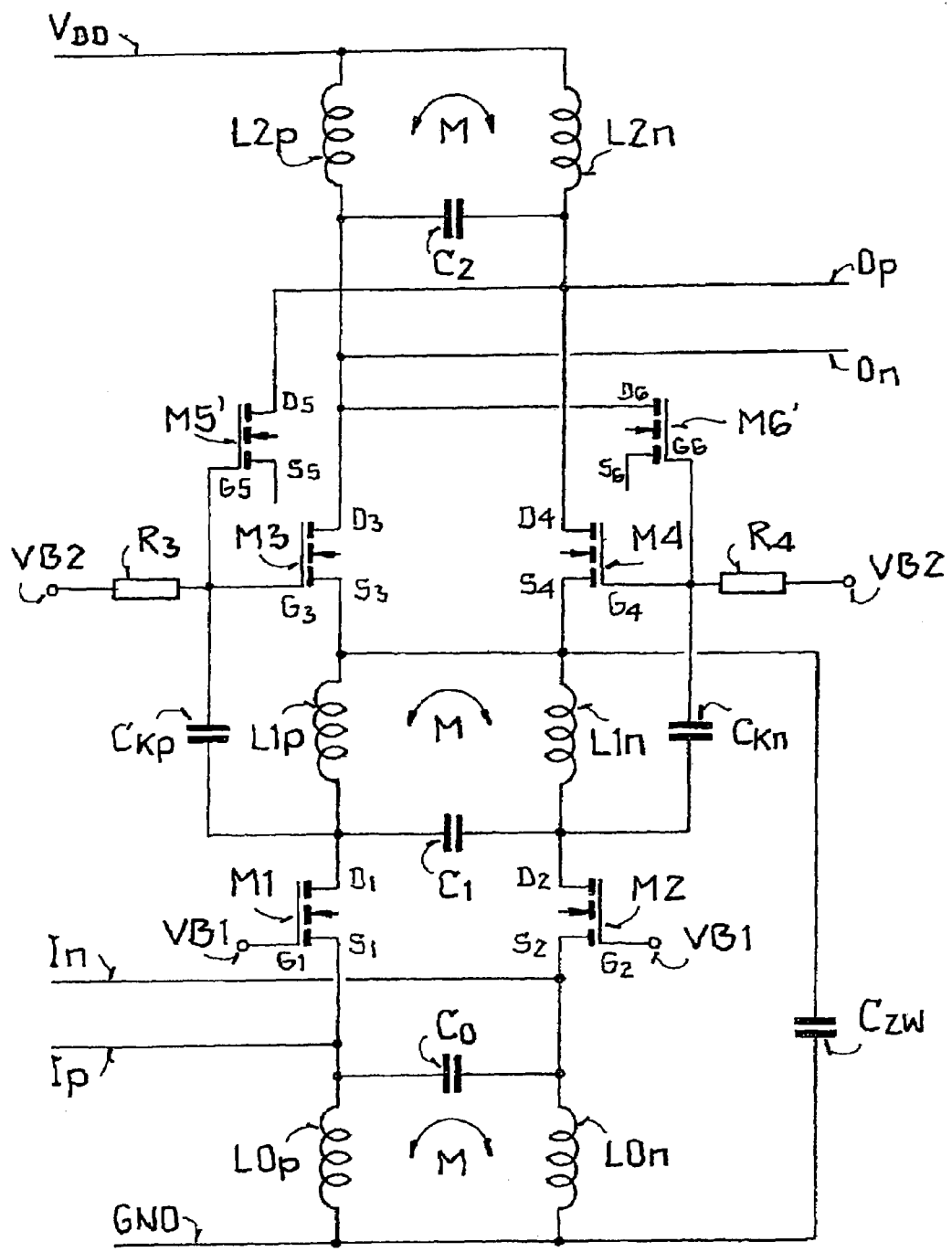
FIG. 3 shows a third circuit of a differential amplifier with neutralization of the Miller capacitances.

In order to reduce, if necessary, the effects of the Miller capacitance of the third transistor M3 and the fourth transistor M4, other exemplary embodiments of the invention, which for the most part compensate for the Miller effect, are shown in FIGS. 2 and 3.

FIG. 2 shows a second amplifier stage, which has a fifth transistor M5 and a sixth transistor M6, in addition to the third transistor M3 and the fourth transistor M4. The fifth transistor M5 is wired with the third transistor M3 into a first cascode arrangement. The fourth transistor M4 is wired with the sixth transistor M6 into a second cascode arrangement. The gate terminals G5 and G6 of the fifth transistor M5 and the sixth transistor M6 are connected to a constant-voltage source $V_{B2}$.

The drain terminals D5 and D6 of the fifth transistor M5 and the sixth transistor M6 are connected to the additional resonant circuit $L_{2p}$, $L_{2n}$, $C_2$ and the outputs $O_p$ and $O_n$. In addition to preventing the Miller effect, the cascode arrangement holds the advantage that a greater amplification is achievable by the second stage. Furthermore, only the transistors M5 and M6 need to have the necessary breakdown voltage stability for the output voltage swing.

A third exemplary embodiment is shown in FIG. 3. The second amplifier stage has the transistors M5' and M6', in addition to the third transistor M3 and the fourth transistor M4 in the emitter circuit. The transistors M5' and M6' are connected in a neutralizing circuit (cross quad) for neutralizing the Miller capacitance. To neutralize the Miller capacitance of the fourth transistor M4, the sixth gate terminal G6 of the sixth transistor M6' is connected to the fourth gate terminal G4 of the fourth transistor M4. Furthermore, the sixth drain terminal D6 of the sixth transistor M6' is connected to the third drain terminal D3 of the third transistor M3. To neutralize the Miller capacitance of the third transistor M3, the fifth gate terminal G5 of the fifth transistor M5' is connected to the third gate terminal G3 of the third transistor M3. Furthermore, the fifth drain terminal D5 of the fifth transistor M5' is connected to the fourth drain terminal D4 of the fourth transistor M4. The source terminals S5 and S6 are not connected.

The embodiment variant of FIG. 3 has the advantage that at the operating point the DC voltage dropping across the second amplifier stage is low, so that a higher output swing is available at lower supply voltages $V_{DD}$. Furthermore, the exemplary embodiment has an improved stability compared with the cascode circuit.

Figure 4:
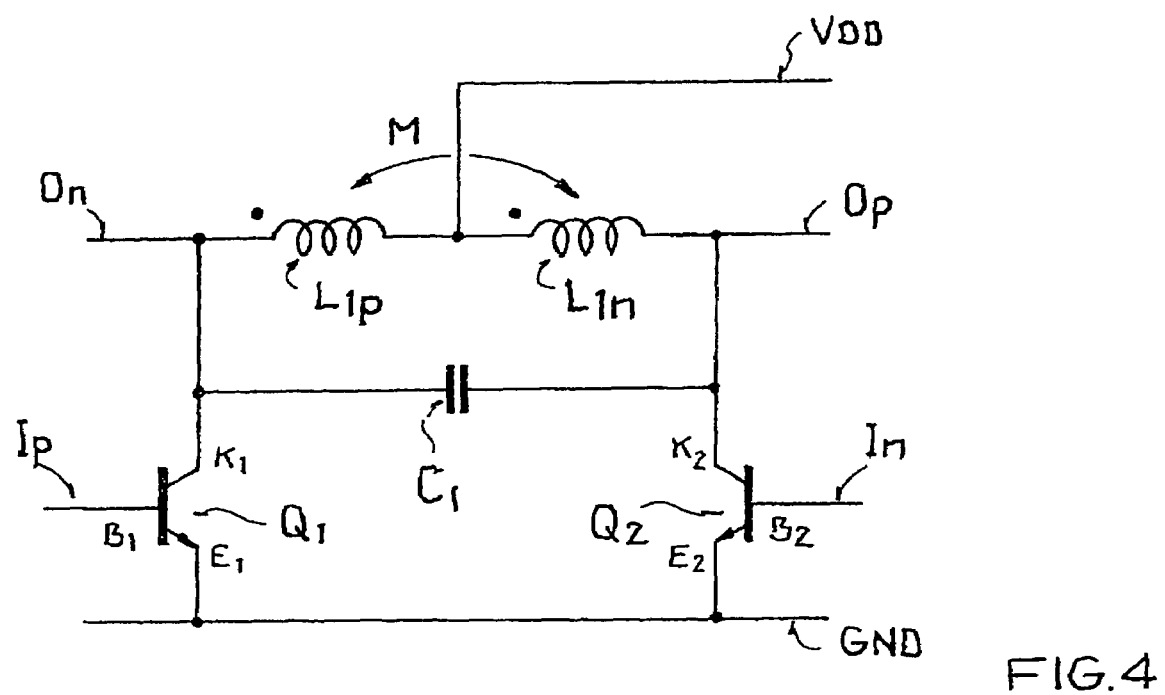
FIG. 4 shows a fourth circuit of a differential amplifier with differential npn bipolar transistors in the emitter circuit.

Another embodiment variant is shown in FIG. 4. A first base B1 of a first npn bipolar transistor Q1 is connected to an input $I_p$ of the differential amplifier. A second base B2 of a second npn bipolar transistor Q2 is connected to another input $I_n$ of the differential amplifier. The first npn bipolar transistor Q1 and the second npn bipolar transistor are wired differentially into the emitter circuit. The emitters E1 and E2 of the two npn bipolar transistors Q1 and Q2 are formed with a resonant circuit comprising a capacitor $C_1$ and a coil with a center tap, whose first inductor $L_{1p}$ is coupled to the second inductor $L_{1n}$ via the coupling coefficient M. The winding direction of both coil parts is the same, as shown in FIG. 4. The outputs $O_n$ and $O_p$ of the single-stage differential amplifier are connected to the collectors K1 or K2 of the npn bipolar transistors Q1 or Q2. This exemplary embodiment has the advantages of a higher input impedance and a very low supply voltage. Elements for operating point setting have been omitted in FIG. 4 for the benefit of a simplified presentation.

Alternatively to the exemplary embodiments shown in FIGS. 1 to 4, it is also possible to use P-channel field-effect transistors. A combined use of N-channel field-effect transistors and P-channel field-effect transistors is also advantageous, for example, to use the lower transistor noise of a P-channel field-effect transistor in the input amplifier stage. A combined use of field-effect transistors and bipolar transistors in one and the same differential amplifier is also advantageous. Accordingly, it is possible to wire a differential gate circuit, a differential base circuit, a differential source circuit, a differential emitter circuit, a differential drain circuit, and/or a differential collector circuit or a combination of different amplifier basic circuits. According to the type of the wired differential amplifier basic circuit, the input impedance and the frequency response of the differential amplifier can be matched to the application.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A differential amplifier comprising:
   a first input;
   a second input;
   a first transistor;
   a second transistor;
   a first inductor that is magnetically coupled to a second inductor; and
   a capacitor,
   wherein the capacitor, the first inductor, and the second inductor are wired into a resonant circuit so that the resonant circuit provides a common-mode impedance when a common-mode signal is applied to said first and second input and a push-pull impedance, which is different than the common-mode impedance, when a push-pull signal is applied to said first and second input, and
   wherein a first source terminal or a first emitter terminal of the first transistor is connected to a first input of the differential amplifier, and wherein a second source terminal or a second emitter terminal of the second transistor is connected to a second input of the differential amplifier.

2. The differential amplifier according to claim 1, wherein the resonant circuit is connected to the first transistor and to the second transistor so that the resonant circuit forms a symmetric load for the first transistor and for the second transistor.

3. The differential amplifier according to claim 1, wherein the first transistor and the second transistor are wired into a gate circuit or a base circuit.

4. A differential amplifier comprising:
   a first transistor;
   a second transistor;
   a first inductor that is magnetically coupled to a second inductor; and
   a capacitor,
   wherein the capacitor, the first inductor, and the second inductor are wired into a resonant circuit so that the resonant circuit has a common-mode impedance for a common-mode signal and a push-pull impedance, which is different than the common-mode impedance, for a push-pull signal,
   wherein the resonant circuit is connected to the first transistor and to the second transistor so that the resonant circuit forms a symmetric load for the first transistor and for the second transistor, and wherein a first source terminal or a first emitter terminal of the first transistor is connected to a first input of the differential amplifier, and wherein a second source terminal or a second emitter terminal of the second transistor is connected to a second input of the differential amplifier.

5. The differential amplifier according to claim 1, wherein a transconductance of the first transistor and a transconductance of the second transistor are designed to form an input impedance of the differential amplifier of 50 ohm within the scope of manufacturing tolerances.

6. The differential amplifier according to claim 1, wherein a first source terminal or a first emitter terminal of the first transistor and a second source terminal or a second emitter terminal of the second transistor are connected to another resonant circuit of the differential amplifier.

7. The differential amplifier according to claim 6, wherein, for the push-pull signal, the resonance frequency of both resonant circuits is substantially the same.

8. The differential amplifier according to claim 1, wherein the first inductor and the second inductor are formed by substantially symmetric coil windings.

9. The differential amplifier according to claim 1, wherein the first inductor and the second inductor are formed by an integrated coil with the a central tap.

10. The differential amplifier according to claim 1, wherein the first inductor and the second inductor are magnetically coupled in such a way that the voltage signal dropping across the first inductor due to a load current and the voltage signal induced by the magnetic field generated by the second inductor are superimposed destructively for common-mode signals and constructively for push-pull signals.

11. The differential amplifier according to claim 1, wherein the differential amplifier is a selective amplifier for amplifying an operating frequency, wherein a resonance of the resonant circuit corresponds to the operating frequency.

12. The differential amplifier according to claim 1, further comprising first and second cascaded amplifier stages, wherein the first amplifier stage has the first transistor and the second transistor (M2), wherein the second amplifier stage has a third transistor and a fourth transistor (M4), and wherein the first amplifier stage and the second amplifier stage are operated by a substantially identical operating current, which flows through the first amplifier stage and through the second amplifier stage.

13. The differential amplifier according to claim 12, wherein the third transistor and the fourth transistor are each wired into a source circuit or an emitter circuit, wherein a third gate terminal or a third base terminal of the third transistor is connected via a first coupling capacitor to the first drain terminal or to the first collector terminal of the first transistor, and wherein a fourth gate terminal or a fourth base terminal of the fourth transistor is connected via a second coupling capacitor to the second drain terminal or to the second collector terminal of the second transistor.

14. The differential amplifier according to claim 12, further comprising a fifth transistor, which is connected with the third transistor to form a first cascode stage, and a sixth transistor, which is connected with the fourth transistor to form a second cascode stage.

15. The differential amplifier according to claim 12, further comprising a first neutralizing capacitor, which is connected to the third transistor and the fourth transistor to neutralize the Miller capacitance of the third transistor, and a second neutralizing capacitor, which is connected to the fourth transistor and the third transistor for neutralizing the Miller capacitance of the fourth transistor.

16. The differential amplifier according to claim 15, wherein the first neutralizing capacitor is formed by a fifth transistor, and the second neutralizing capacitor is formed by a sixth transistor.

17. The differential amplifier according to any 12, further comprising an additional resonant circuit that is a load for the second amplifier stage, wherein the additional resonant circuit is connected to the third transistor and the fourth transistor or to the fifth transistor and the sixth transistor to form the second amplifier stage.

18. A radio system for communication, comprising a differential amplifier for amplifying a transmission frequency, the differential amplifier comprising:
   a first input;
   a second input;
   a first inductor that is magnetically coupled to a second inductor; and
   a capacitor,
   wherein the capacitor, the first inductor, and the second inductor are wired into a resonant circuit so that the resonant circuit provides a common-mode impedance when a common-mode signal is applied to said first and second input and a push-pull impedance, which is different than the common-mode impedance, when a push-pull signal is applied to said first and second input.

19. The differential amplifier according to claim 11, wherein the operating frequency is 2.4 GHz.

20. The radio system according to claim 18, wherein the transmission frequency is 2.4 GHz.

21. The differential amplifier according to claim 1, wherein the push-pull signal is configured to be amplified greater than the common-mode signal.

* * * * *